(12) United States Patent
Yip et al.

(10) Patent No.: US 9,850,074 B2
(45) Date of Patent: Dec. 26, 2017

(54) ELECTRONIC DEVICE SEPARATOR FOR A FEEDING APPARATUS

(71) Applicant: ASM Technology Singapore Pte Ltd, Singapore (SG)

(72) Inventors: Shing Kai Yip, Kwai Chung (HK); Yu Sze Cheung, Tuen Mun (HK); Chi Wah Cheng, Tsing Yi (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/089,885

(22) Filed: Apr. 4, 2016

(65) Prior Publication Data

US 2017/0283178 A1    Oct. 5, 2017

(51) Int. Cl.
*B65G 47/00*    (2006.01)
*B65G 25/04*    (2006.01)
*H01L 21/677*    (2006.01)

(52) U.S. Cl.
CPC ........ *B65G 25/04* (2013.01); *H01L 21/67793* (2013.01); *B65G 2812/03* (2013.01); *B65G 2812/12* (2013.01)

(58) Field of Classification Search
CPC ...................................................... B65G 47/00
USPC ....... 198/530, 531, 533, 463.4, 463.6, 459.1
See application file for complete search history.

(56) References Cited

U.S. PATENT DOCUMENTS 6,116,463 A * 9/2000 Telkamp .............. H05K 13/021
                                                    221/123

\* cited by examiner

*Primary Examiner* — Leslie A Nicholson, III
*Assistant Examiner* — Lester Rushin
(74) *Attorney, Agent, or Firm* — Ostrolenk Faber LLP

(57) ABSTRACT

A feeding apparatus for supplying electronic devices for pick-up comprises a guide track for guiding and feeding a plurality of electronic devices and a separator operative to receive electronic devices from the guide track for the electronic devices to be picked up from the separator. A protrusion is located on either of the guide track or the separator, and a cavity is located on the other of the guide track or the separator for receiving the protrusion. The protrusion and the cavity cooperate to form a substantially continuous surface for transferring the electronic devices to the separator.

10 Claims, 9 Drawing Sheets

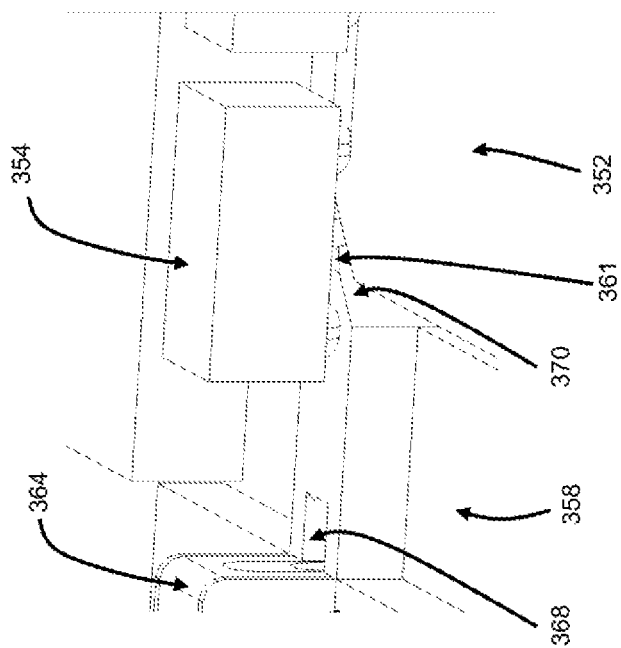
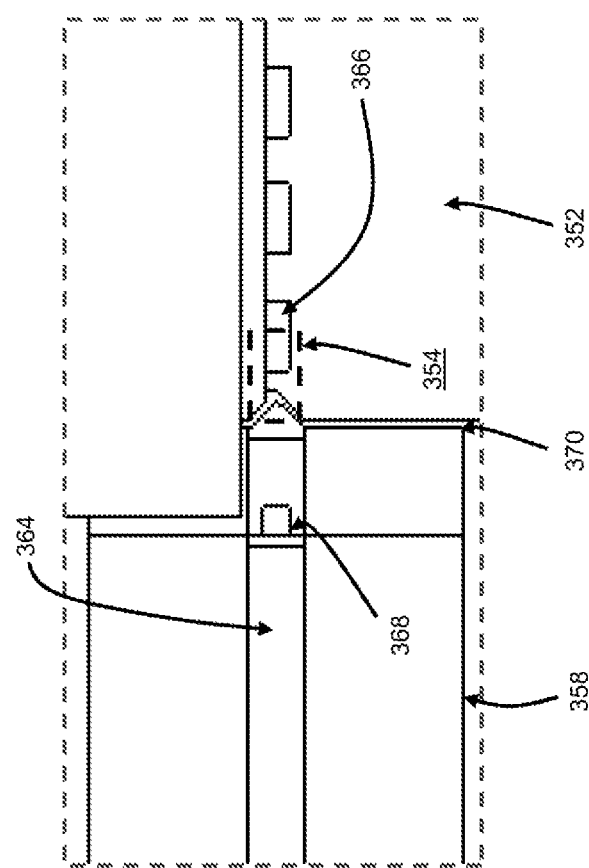
FIG. 4B
FIG. 4A

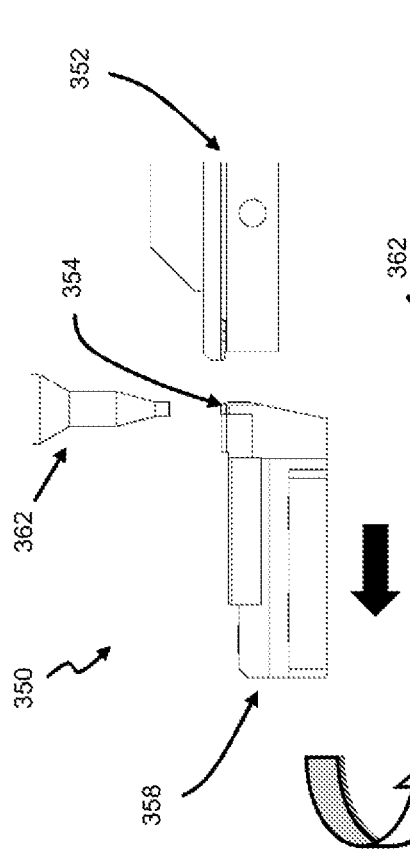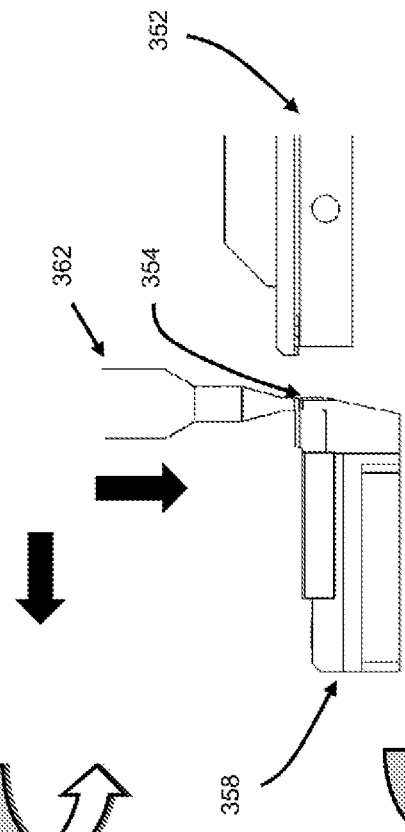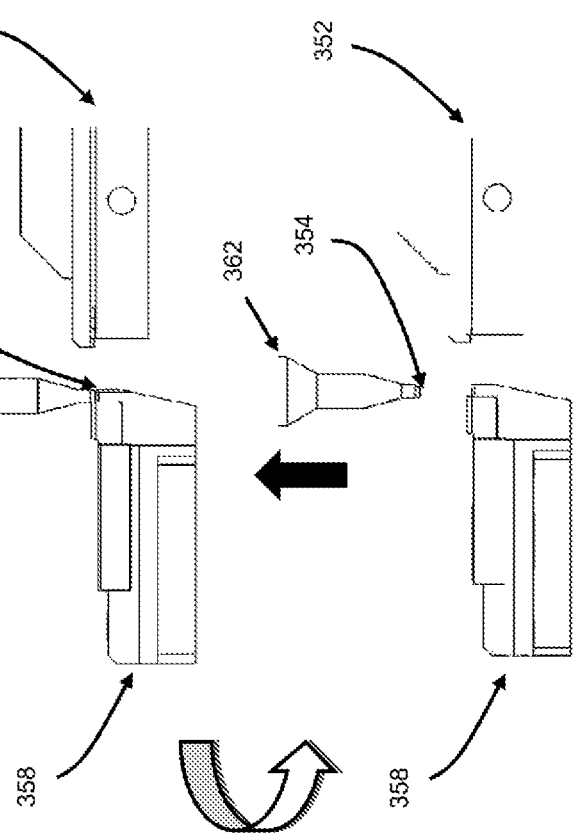

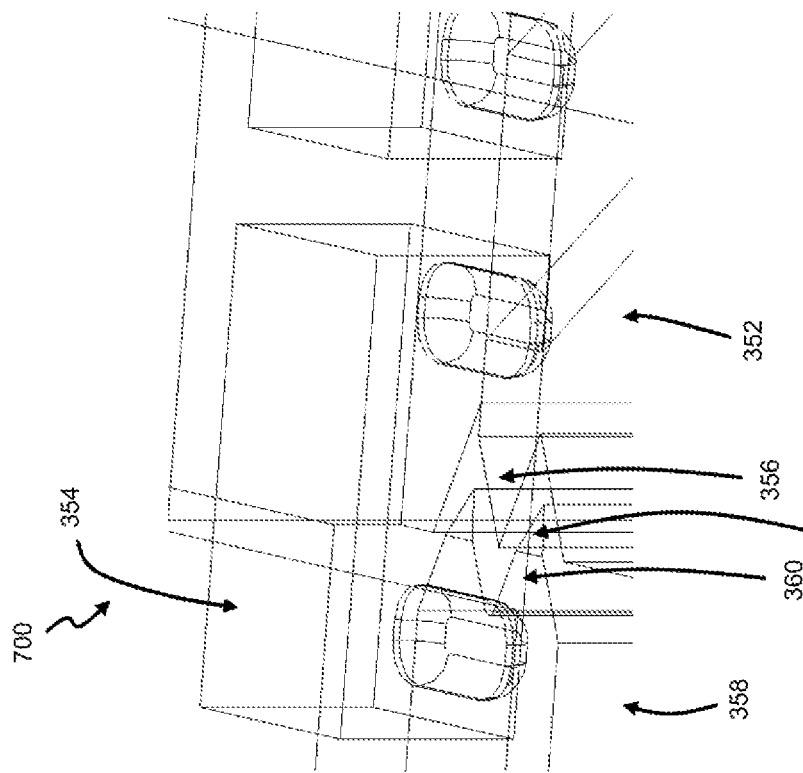
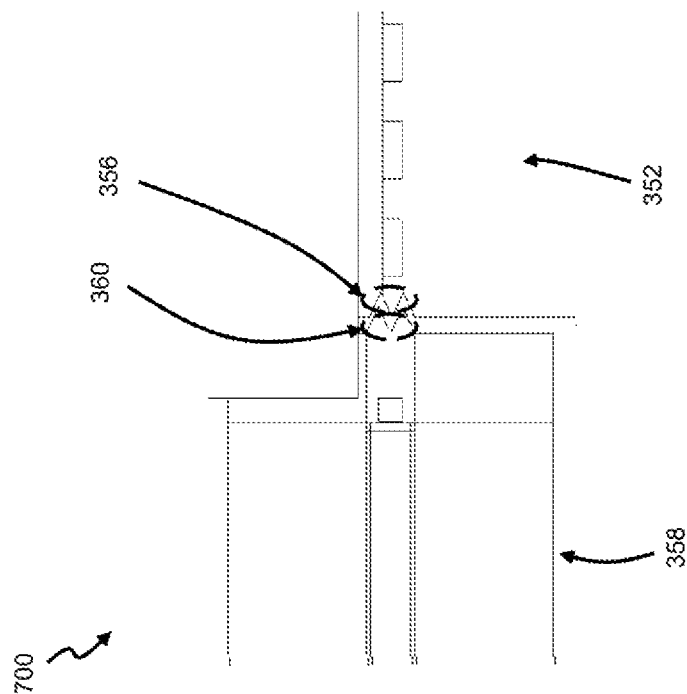

ELECTRONIC DEVICE SEPARATOR FOR A FEEDING APPARATUS

FIELD OF THE INVENTION

The present invention relates to an electronic device separator for a feeding apparatus, and in particular to an electronic device separator which receives electronic devices for removal from the apparatus.

BACKGROUND AND PRIOR ART

For industrial assembly automation applications, vibratory bowl feeders are commonly used to automatically feed individual components (e.g. electronic devices manufactured using Wafer-level packaging) along semiconductor packaging and assembly lines. Presently, electronic devices to be fed by such vibratory bowl feeders are typically fed in a sequential queue, and separated from other electronic devices in the queue by using hard stoppers and/or vacuum suction at the end of a feeding track before being removed by a pick head. However, because the electronic devices tend to be rather fragile devices with brittle edges, it has been observed during the process of transferring them from the feeding track that collisions of said edges of the electronic devices with the feeding apparatus may frequently result in unacceptable chipping. From investigations, it has further been found that the front edge of a conventional separator (such as that found in a vibrational bowl feeder) is usually the cause of such chipping. Needless to say, such electronic devices with chipped edges are defective and have to be discarded, undesirably lowering effective yield and increasing overall costs of production.

To illustrate the problem, referring to FIGS. 1A and 1B depicting a conventional feeding apparatus 100, electronic devices 102 carried on a guide track 104 are fed to a separator 106. The guide track 104 and the separator 106 are typically separated by a small gap 108, such that each electronic device 102 must be made to cross the gap 108 when being transferred from the guide track 104 to the separator 106. Thereafter, the transferred electronic device 102 sits on the separator 106 until it is picked up by a pick head (not shown). Since the electronic device 102 is physically rather small, the electronic device 102 may tilt slightly (at its front end) during its transfer from the guide track 104 to the separator 106 (see FIGS. 2A and 2B). As a result, a lower front edge of the electronic device 102 and associated corners thereof may collide against an edge of the separator 106 during the transfer. Undesirably, this may consequently cause the lower front edge or corners of the electronic device 102 to be chipped, thus rendering the damaged electronic device 102 defective and it has to be discarded.

One object of the present invention is therefore to seek to lower the risk of damage to electronic devices 102 when they are being transferred from the guide track 104 to the separator 106.

These and other aspects of the invention will be apparent from and elucidated with reference to the embodiments described hereinafter.

SUMMARY OF THE INVENTION

Accordingly, the invention provides a feeding apparatus for supplying electronic devices for pick-up, the feeding apparatus comprising: a guide track for guiding and feeding a plurality of electronic devices; a separator operative to receive electronic devices from the guide track for the electronic devices to be picked up from the separator; and a protrusion which is located on either of the guide track or the separator, and a cavity located on the other of the guide track or the separator that is configured to receive the protrusion, such that the protrusion and the cavity cooperate to form a substantially continuous surface for transferring the electronic devices to the separator.

Beneficially, the proposed apparatus enables electronic devices to be guided at all times when moving over a gap between the guide track and the separator, and advantageously prevents edges of the electronic devices from chipping.

Preferably, the protrusion is located at an end portion of the separator, and the cavity is located at an end portion of the guide track.

Alternatively, the protrusion may be located at an end portion of the guide track, and the cavity may be located at an end portion of the separator.

Preferably, the protrusion and cavity are V-shaped or W-shaped from a plan view of the feeding apparatus.

Preferably, one or more chamfers are located at one or more tip ends of the protrusion.

Preferably, there is a gap is between the protrusion and the cavity at the first position of the separator.

BRIEF DESCRIPTION OF THE DRAWINGS

Embodiments of the invention are disclosed hereinafter with reference to the accompanying drawings, in which:

FIGS. 4A and 4B which respectively depict a top view and an isometric view of an electronic device being transferred from a guide track to a separator of the feeding apparatus of FIGS. 3A and 3B;

FIGS. 5A to 5F, illustrates a method of using a separator according to the first preferred embodiment of the invention;

FIGS. 7A and 7B which respectively depict a top view and an isometric view of a feeding apparatus according to a second preferred embodiment of the invention.

DETAILED DESCRIPTION OF PREFERRED EMBODIMENTS

Figure 1B:
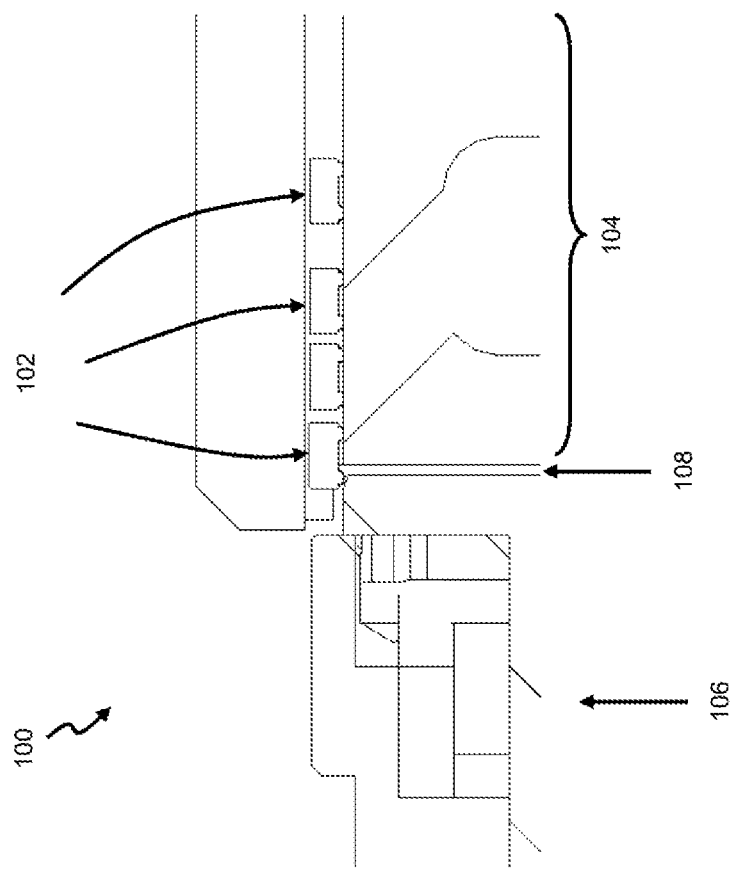
FIGS. 1A and 1B which respectively depict an isometric view and a side view of a conventional feeding apparatus according to the prior art.
Figure 1A:
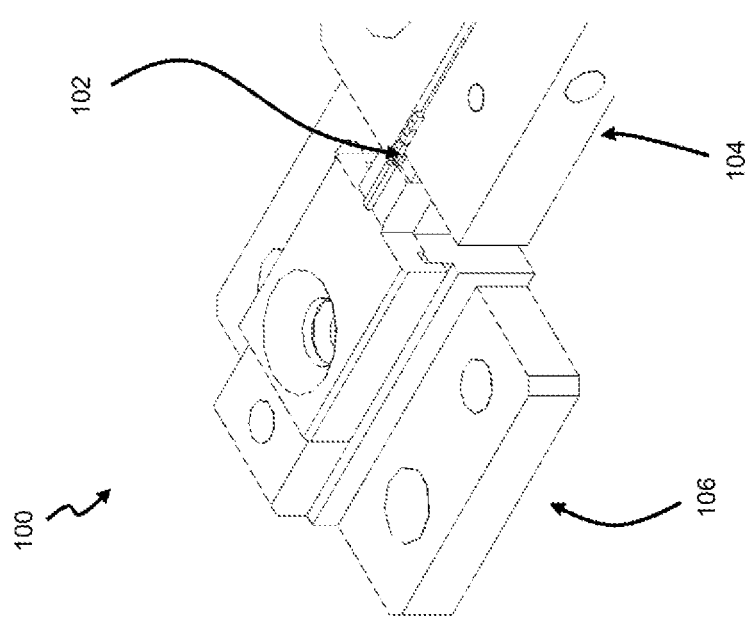
Figures 2A, 2B:
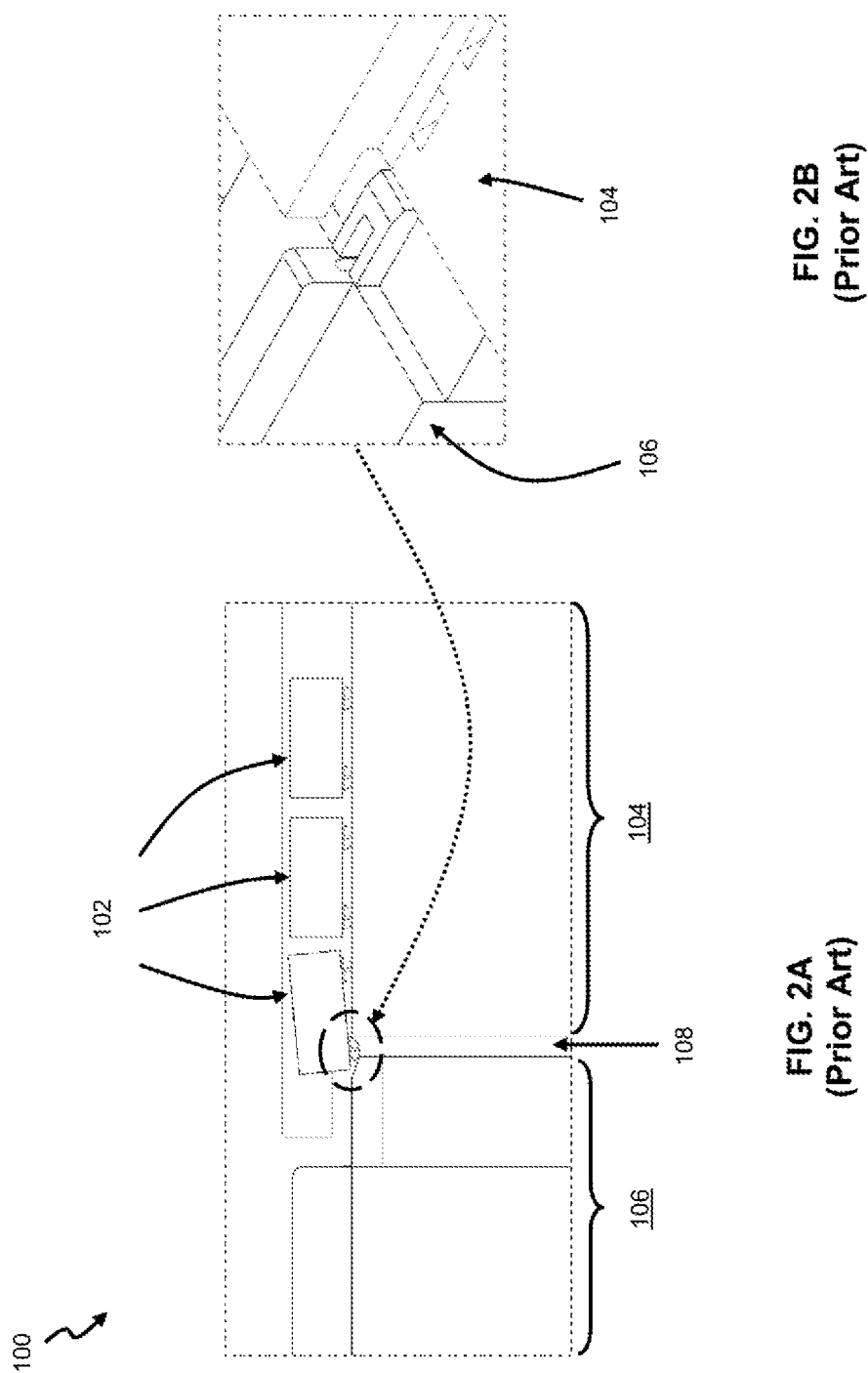
FIGS. 2A and 2B, which are respectively magnified side and isometric views of selected portions of the conventional separator apparatus of FIGS. 1A and 1B.
Figure 3B:
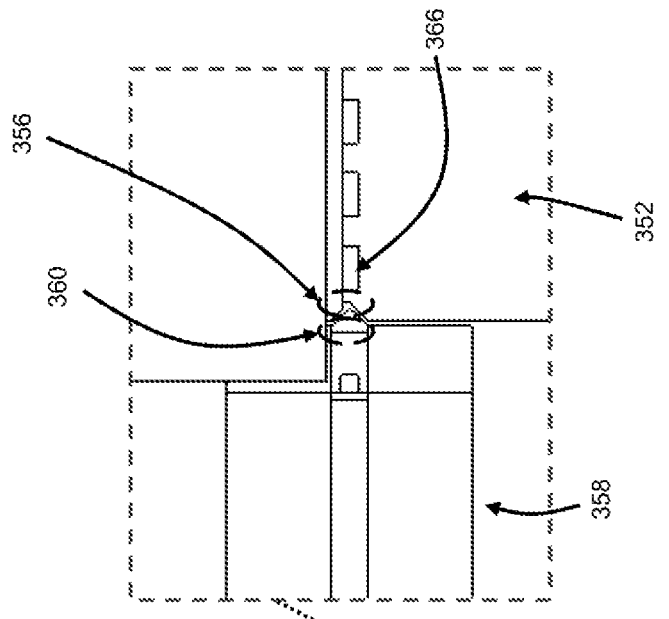
FIGS. 3A and 3B which respectively depict an isometric view and a plan view of the feeding apparatus according to a first preferred embodiment of the invention.
Figure 3A:
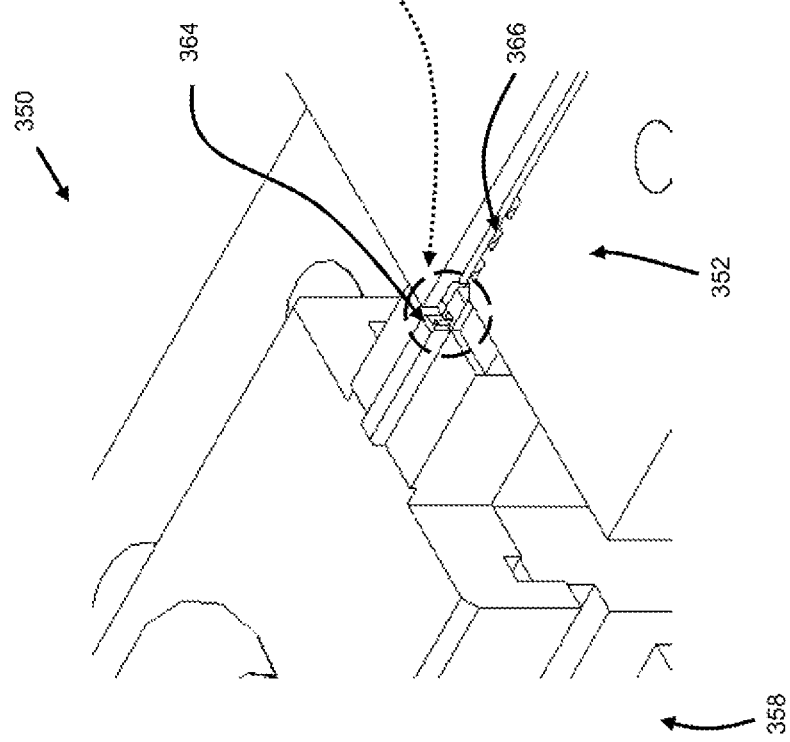

FIGS. 3A and 3B respectively depict an isometric view and a plan view respectively of a feeding apparatus 350 and a separator 358 comprised in the feeding apparatus 350 according to a first preferred embodiment of the invention. The feeding apparatus 350 broadly comprises a guide track 352 arranged to guide and feed a plurality of electronic devices 354. The separator 358 has an end portion 360 which may be in the form of a protrusion from the separator 358. Correspondingly, the guide track 352 has an end portion 356 which may be in the form of a cavity in the guide track 352. Alternatively, the separator end portion 360 may instead be in the form of a cavity, and the guide track end portion 356 may be in the form of a protrusion.

The separator 358 including its separator end portion 360 is locatable adjacent to the guide track end portion 356 and is configured for reciprocating motion relative to the guide track 352. The separator 358 is linearly movable relative to the guide track 352 between a first position next to the guide track 352 to receive electronic devices 354 from the guide track 352 and a second position spaced from the guide track 352 for the electronic devices 354 to be picked up from the separator 358. The respective end portions 356, 360 cooperate to provide a substantially continuous guiding surface for enabling the transfer of electronic devices 354 from the guide track 352 to the separator 358, when the separator end portion 358 is moved adjacent to the guide track end portion 356.

It should be appreciated that when the separator 358 is at its end position next to the guide track 352, there is still a small gap that separates the guide track end portion 356 from the separator end portion 360 due to unavoidable design tolerances to ensure that the separator end portion 360 does not collide into the guide track end portion 356 during reciprocating motion of the separator 358.

As depicted in FIG. 3B which includes a plan view of the separator 358, the separator end portion 360 comprises a substantially V-shaped protrusion. However, variations are possible such as that described in the second embodiment below. In this instance, the guide track end portion 356 is designed in the form of a V-shaped cavity (from a plan view of the feeding apparatus 350) which is adapted to receive the separator end portion 360, comprising a corresponding V-shaped protrusion. That is, the respective end portions 356, 360 are mutually adapted to cooperate with each other to form a substantially continuous surface to enable the transfer of electronic devices 354 from the guide track 352 to the separator 358.

It should be noted that the motion amplitude of the reciprocating motion of the separator 358 as described above can be very small. In the event, for some special applications, there may not be a need for the separator to move relative to the guide track 352 at all. In such cases, there will not be different first and second positions of the separator 358, but the function of the separator 358 for receiving electronic devices 354 to be picked up would remain the same.

The feeding apparatus 350 may also include a pick head 362 (see FIGS. 5A to 5F) arranged to use vacuum suction to pick up an electronic device 354 that has been transferred to the separator 358, and to move the electronic device 354 to another location for downstream processing. It is to be appreciated that the electronic devices 354 include a plurality of such electronic devices 354 that are linearly arranged in a queue on the guide track 352 to be individually and separately fed to the separator 358.

Multiple guide track vacuum ports 366 are located along the guide track 352 for resisting movement by the plurality of electronic devices 354 when necessary, in particular, when a single electronic device 354 is being fed to the separator 358. In this case, the rest of the electronic devices 354 are restrained from following the single electronic device 354 that is being fed to the separator 358. There is also a separator vacuum port 368 located on the separator 358 next to a stopper 364 to secure the electronic device 354 before it is picked up by the pick head 362.

FIGS. 4A and 4B respectively depict a top view and an isometric view of an electronic device being transferred from a guide track to a separator of the feeding apparatus of FIGS. 3A and 3B. The electronic device 354 is illustrated in FIG. 4A in dotted lines when it is about to cross from the guide track 352 to the separator 358. The vacuum suction port 366 nearest to the separator 358 is switched off in order for the electronic device 354 to move towards the separator 358.

In FIG. 4B, the electronic device 354 is shown crossing a V-shaped gap 370 between the guide track 352 and the separator 358. The electronic device 354 will move in the direction of the separator 358 until it comes to rest at the stopper 364. The separator vacuum suction port 368 will then hold the electronic device 354 with vacuum suction when the separator 358 moves away from the guide track 352 to prepare the electronic device 354 for pick-up. FIG. 4B also shows that a tip end of the separator end portion 360 includes a chamfer 361 for ensuring smooth conveyance of each electronic device 354 from the guide track 352 to the separator 358.

FIGS. 5A to 5F illustrate a method of using a separator according to the first preferred embodiment of the invention. FIGS. 6A to 6E show isometric views of respective steps which are equivalent to those illustrated by FIGS. 5A to 5F.

Figure 5A:
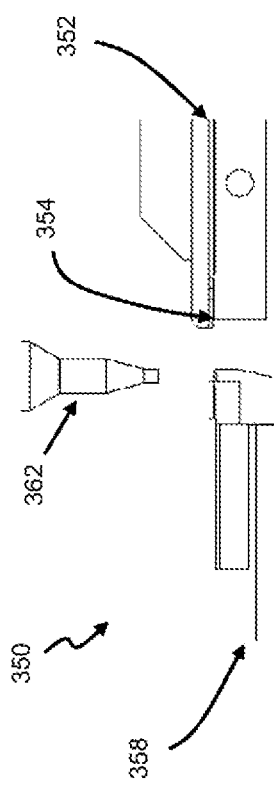
Figure 5B:
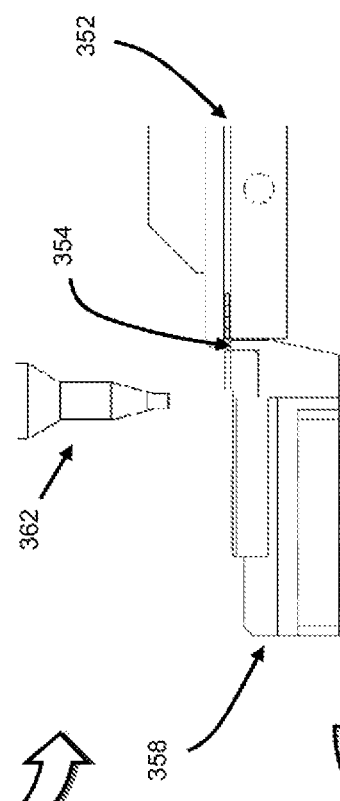
Figure 6A:
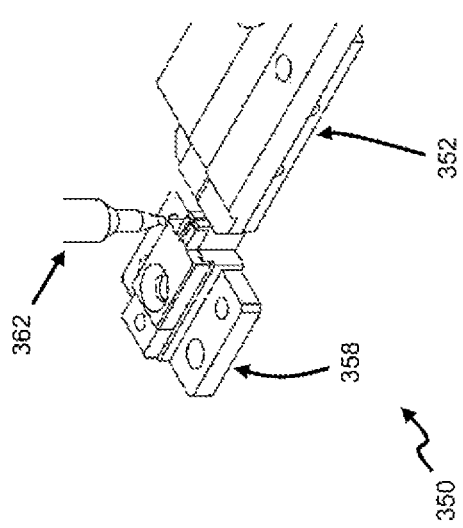
FIGS. 6A to 6E, shows isometric views of respective steps which are equivalent to those illustrated by FIGS. 5A to 5F.
Figure 6B:
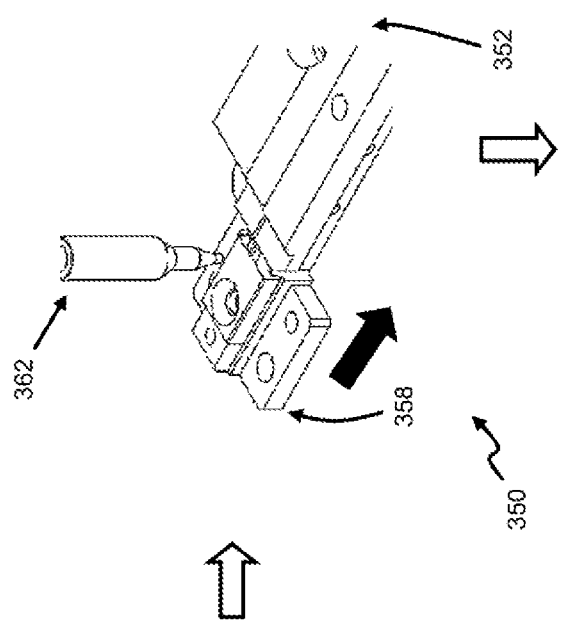

In the method according to the invention, a plurality of electronic devices 354 is fed towards the guide track end portion 356 of the guide track 352 (FIG. 5A and FIG. 6A). The separator 358 is then moved from its standby position towards the guide track 352 (FIG. 5B and FIG. 6B). At this time, the plurality of electronic devices 354 is restrained by the guide track vacuum suction ports 366 from moving.

Figure 5C:
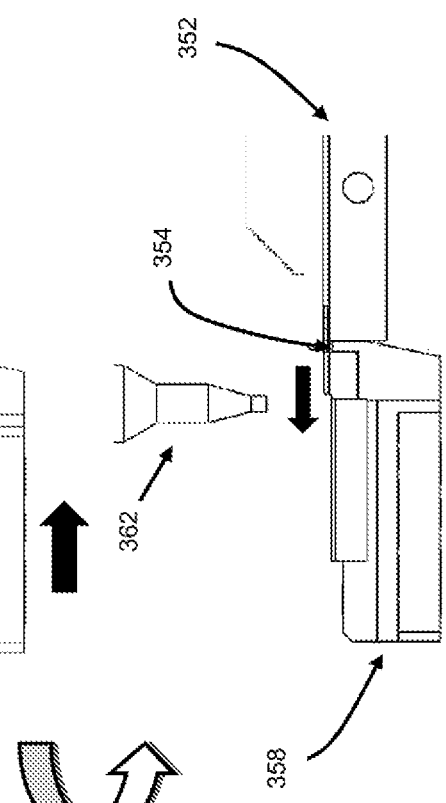

Thereafter, a single electronic device 354 is fed from the guide track 352 to the separator 358 when the guide track vacuum suction port 366 closest to the separator 358 is switched off (FIG. 5C). The electronic device 354 travels along a substantially continuous guiding surface provided by the V-shaped cavity at the guide track end portion 356 cooperating with the V-shaped protrusion at the separator end portion 360. With such a configuration, a part of the electronic device 354 is guided at all times when it is moving from the guide track 352 to the separator 358 across the gap 370, and hence this feature advantageously reduces the risk of chipping of the electronic device 354.

Figure 6C:
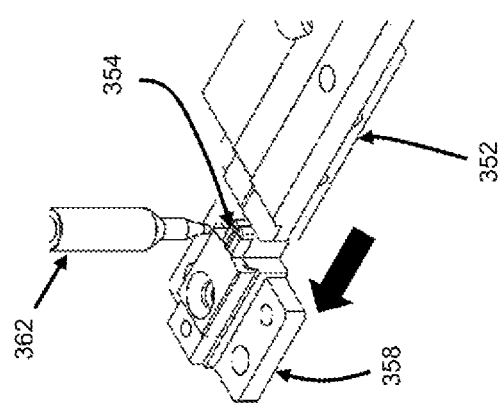
Figure 6E:
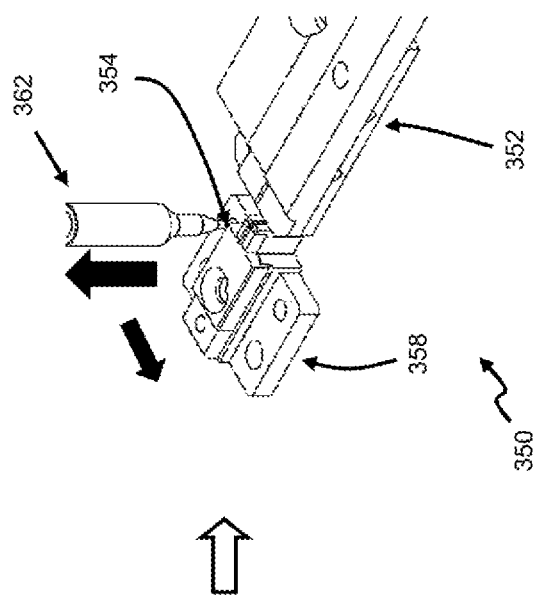
Figure 6D:
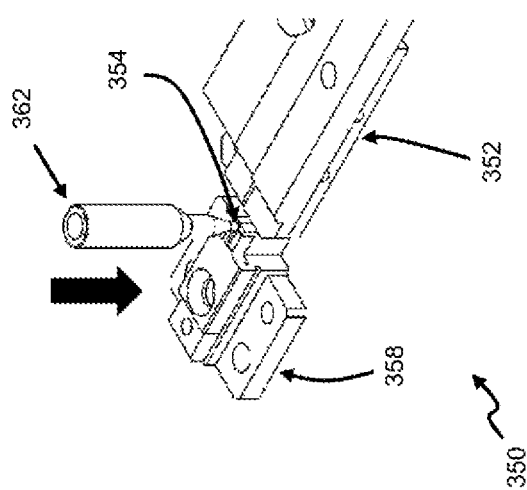

After the electronic device 354 has been transferred to the separator 358 and is secured by the separator vacuum suction port 368 next to the stopper 364, the separator 358 moves away from the guide track 352, and returns to its standby position (FIG. 5D and FIG. 6C). After the separator 358 has moved to the standby position, the pick head 362 is lowered to contact the electronic device 354 which is resting on the separator 358 (FIG. 5E and FIG. 6D). The electronic device 354 can now be picked up by the pick head 362 using vacuum suction, and the pick head 362 subsequently moves the electronic device 354 to another location for downstream processing (i.e. FIG. 5F and FIG. 6E). The above steps are thereafter repeated for transferring further electronic devices 354 individually from the guide track 352 to the separator 358 in the same manner as described above to be picked up by the pick head 362.

FIGS. 7A and 7B respectively depict a top view and an isometric view of a feeding apparatus 700 according to a second preferred embodiment of the invention. For the sake of brevity, description of like elements, functionalities and operations that are common between the different configurations are not repeated; reference will instead be made to dissimilar parts of the relevant configurations.

According to the second preferred embodiment, a W-shaped arrangement (from a plan view of the feeding apparatus 350) is adopted instead of the V-shaped arrangement of the first embodiment. So in this case, the guide track end portion 356 is configured to be a W-shaped cavity which receives and cooperates with the separator end portion 360 that includes a W-shaped protrusion which is received into the W-shaped cavity of the guide track end portion 356. Chamfers 361 are further located at respective tip ends of the separator end portion 360.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention. For example, the respective end portions 356, 360 may be generalized to any suitable shape, so long as their combination forms a substantially continuous guiding surface notwithstanding a gap 370 therebetween. Further, it is to be appreciated that the guide track end portion 356 may also be configured as a protrusion, whereas the separator end portion 360 may be correspondingly configured as a cavity that is arranged to receive the said protrusion of the guide track end portion 356.

The invention claimed is:

1. A feeding apparatus for supplying electronic devices for pick-up, the feeding apparatus comprising:
    a guide track for guiding and feeding a plurality of electronic devices;
    a separator operative to receive electronic devices from the guide track for the electronic devices to be picked up from the separator;
    a protrusion located on at least one of the guide track and the separator, the protrusion comprising an abutment surface extending from a top portion of a side wall of the at least one of the guide track and the separator; and
    a cavity located on the other of the guide track or the separator, the cavity comprising an indented surface recessed into a top portion of a side wall of the guide track or the separator,
    wherein the cavity is configured to receive the protrusion, such that the abutment surface and the indented surface cooperate to form a substantially continuous surface for transferring the electronic devices to the separator; and
    wherein a plane perpendicular to a direction of travel of the electronic devices intersects at the cavity portions of both the abutment surface and the indented surface comprised in the substantially continuous surface.

2. The feeding apparatus as claimed in claim 1, wherein the separator is configured to move reciprocally between a first position next to the guide track to receive the electronic devices and a second position spaced from the guide track for the electronic devices to be picked up,
    wherein the substantially continuous surface is formed at the first position of the separator.

3. The feeding apparatus as claimed in claim 2, further comprising a gap between the protrusion and the cavity at the first position of the separator.

4. The feeding apparatus as claimed in claim 1, wherein the protrusion is located at an end portion of the separator, and the cavity is located at an end portion of the guide track.

5. The feeding apparatus as claimed in claim 1, wherein the protrusion is located at an end portion of the guide track, and the cavity is located at an end portion of the separator.

6. The feeding apparatus as claimed in claim 1, wherein the protrusion and cavity are V-shaped from a plan view of the feeding apparatus.

7. The feeding apparatus as claimed in claim 6, further comprising a chamfer located at a tip end of the protrusion.

8. The feeding apparatus as claimed in claim 1, wherein the protrusion and cavity are W-shaped from a plan view of the feeding apparatus.

9. The feeding apparatus as claimed in claim 8, further comprising chamfers located at respective tip ends of the protrusion.

10. A feeding apparatus for supplying electronic devices for pick-up, the feeding apparatus comprising:
    a guide track for guiding and feeding a plurality of electronic devices;
    a separator operative to receive electronic devices from the guide track for the electronic devices to be picked up from the separator;
    a protrusion located on at least one of the guide track and the separator;
    a cavity located on the other of the guide track and the separator, the cavity configured to receive the protrusion such that the protrusion and the cavity cooperate to form a substantially continuous surface for transferring the electronic devices to the separator, the substantially continuous surface is formed at the first position of the separator,
    wherein the separator is configured for reciprocating motion between a first position next to the guide track to receive the electronic devices and a second position spaced from the guide track for the electronic devices to be picked up; and
    further comprising a gap between the protrusion and the cavity at the first position of the separator.

* * * * *